United States Patent
Yamazaki

(12) 
(10) Patent No.: US 6,417,677 B1
(45) Date of Patent: Jul. 9, 2002

(54) ANTISTATIC CONDUCTIVE PIN MOUNTING APPARATUS FOR A PHOTOMASK

(75) Inventor: Hiroshi Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 73 days.

(21) Appl. No.: 09/603,881

(22) Filed: Jun. 26, 2000

Related U.S. Application Data

(62) Division of application No. 09/138,410, filed on Aug. 24, 1998, now Pat. No. 6,146,794.

(30) Foreign Application Priority Data

Aug. 22, 1997 (JP) .............................................. 9-226647

(51) Int. Cl.[7] .............................................. G01R 27/08
(52) U.S. Cl. ...................................... 324/715; 324/761
(58) Field of Search ................................ 324/761, 754, 324/758, 158.1, 715, 713; 430/30

(56) References Cited

U.S. PATENT DOCUMENTS

| | | | | |
|---|---|---|---|---|
| 4,061,969 A | * | 12/1977 | Dean ........................... | 324/761 |
| 4,814,698 A | * | 3/1989 | St. Onge et al. ............. | 324/754 |
| 5,357,396 A | | 10/1994 | Alm ............................. | 361/212 |
| 5,377,071 A | * | 12/1994 | Moslehi ................ | 324/158.1 X |
| 5,400,209 A | | 3/1995 | Moslehi ........................ | 361/234 |
| 5,885,735 A | * | 3/1999 | Imai et al. ...................... | 430/5 |
| 6,097,202 A | * | 8/2000 | Takahashi .................... | 324/761 |
| 6,154,038 A | * | 11/2000 | Ito et al. ...................... | 324/750 |
| 6,160,415 A | * | 12/2000 | Jung ........................... | 324/765 |

FOREIGN PATENT DOCUMENTS

EP 0706209 4/1996

* cited by examiner

*Primary Examiner*—N. Le
*Assistant Examiner*—T. R. Sundaram
(74) *Attorney, Agent, or Firm*—Sughrue Mion, PLLC

(57) ABSTRACT

In an antistatic apparatus for a photomask including a conductive optical shield layer, at least two conductive pins are inserted into the photomask, so that the conductive pins are in contact with the conductive optical shield layer. Then, the photomask is set in a cassette of an electron beam exposure apparatus. Then, the conductive pins are electrically connected to the cassette by conductive plates. Thus, electrons charged at the conductive optical shield layer by electron beams are effectively discharged from the conductive pins to the cassette.

9 Claims, 8 Drawing Sheets

ANTISTATIC CONDUCTIVE PIN MOUNTING APPARATUS FOR A PHOTOMASK

This is a divisional of application Ser. No. 09/138,410 filed Aug. 24, 1998, the disclosure of which is incorporated herein by reference.

BACKGROUND OF THE INVENTION

1. Field of the Invention

U.S. Pat. No. 6,146,794 issued Nov. 14, 2000, the entire disclosure of which is incorporated herein by reference.

2. Description of the Related Art

In an electron beam exposure apparatus, when electrons are charged at a photomask, the focus of electron beams is bent by the charged electrons, so that it is impossible to depict an accurate pattern on the photomask.

On the other hand, a photomask is generally constructed of glass substrate, an optical shield layer made of Cr on the glass substrate, a reflection avoiding layer made of CrO on the optical shield layer, and an electron beam resist layer on the reflection avoiding layer. This photomask is set in a cassette of an electron beam exposure apparatus for depicting a pattern thereon.

In order to prevent electrons from being charged at the photomask, i.e., the optical shield layer thereof, conductive pins supported by springs at the cassette are inserted into the photomask. Thus, electrons charged at the optical shield layer are effectively discharged from the conductive layer. In this case, if a force applied to the conductive pins is insufficient, it is impossible for the conductive pins to penetrate the electron beam resist layer and the reflection avoiding layer. As a result. the conductive pins cannot be in contact with the optical shield layer. Contrary to this, if the force applied to the conductive pins it too strong, an excessive force is applied to the photomask. As a result, the photomask is distorted or deformed, so that it is also impossible to depict an accurate pattern on the photomask.

In a first prior art antistatic method for a photomask, a reflection avoiding layer is reduced in size. as compared with an optical shield layer. As a result, conductive pins easily penetrate the electron beam resist layer to reach the optical shield layers since there is no reflection avoiding layer beneath the conductive pins (see JP-A-4-371952). This will be explained later in detail.

In the first prior art photomask, however, since the formation of the reflection avoiding layer on the optical shield layer by an evaporation process needs a holder for covering the periphery of the optical shield layer, the thickness of the reflection avoiding layer becomes non-uniform particularly around the edge of such a holder.

In a second prior art photomask, a conductive pin is in contact with an electron beam resist, and in addition, a high power supply electrode penetrates the electron beam resist and reaches an optical shield layer. In this state, when a high power supply voltage is applied to the high power supply electrode, the portion of the electron beam resist layer between the conductive pin and the optical shield layer is electrostatically destroyed, so that the conductive pin is electrically in contact with the optical shield layer (see JP-A-2-125416). This will be also explained later in detail. The second prior art photomask, however, makes the apparatus complex, thus increasing the manufacturing cost.

SUMMARY OF THE INVENTION

It is an object of the present invention to provide an improved antistatic method for a photomask without reducing the size of a reflection avoiding layer and without a complex apparatus.

According to the present invention, in an antistatic method for a photomask including a conductive optical shield layer, at least two conductive pins are inserted into the photomask, so that the conductive pins are in contact with the conductive optical shield layer. Then, the photomask is set in a cassette of an electron beam exposure apparatus. Then, the conductive pins are electrically connected to the cassette by conductive plates. Thus, electrons charged at the conductive optical shield layer by electron beams are effectively discharged from the conductive pins to the cassette.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENT

Before the description of the preferred embodiment, prior art photomasks will be explained with reference to FIGS. 1A, 1B, 1C, 1D and 2.

Figure 1A:
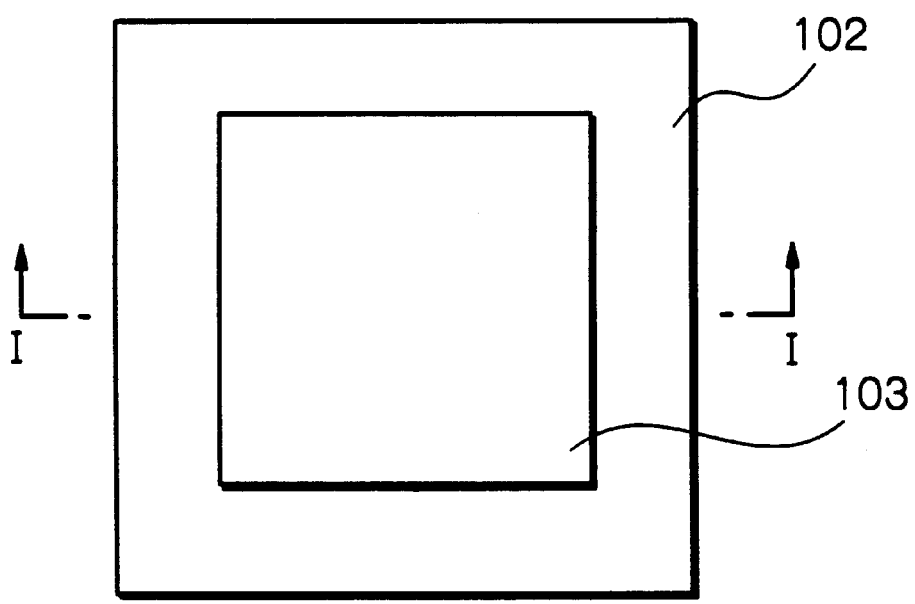
FIG. 1A is a plain view illustrating a first prior art photomask.
Figure 1B:
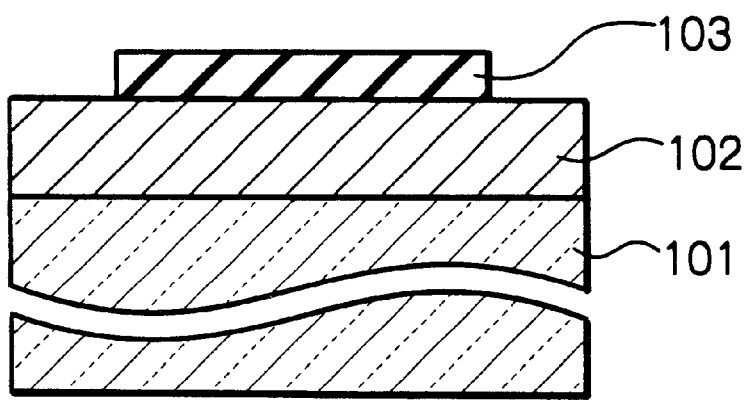
FIG. 1B is a cross-sectional view taken along the line I—I of FIG. 1A.

FIG. 1A illustrates a first prior art photomask and FIG. 1B is a cross-sectional view taken along the line I—I of FIG. 1A (see JP-A-4-371952). In FIGS. 1A and 1B, reference 101 designates a glass substrate on which an optical shield layer 102 made of Cr is formed. Also, a reflection avoiding layer 103 made of CrO is formed on the optical shield layer 102, thus suppressing the reduction of accuracy of patterns by multiple reflection during a wafer exposure process. In this case, the reflection avoiding layer 103 is reduced in size as compared with the optical shield layer 102, and accordingly, the periphery of the optical shield layer 102 is exposed.

Figure 1C:
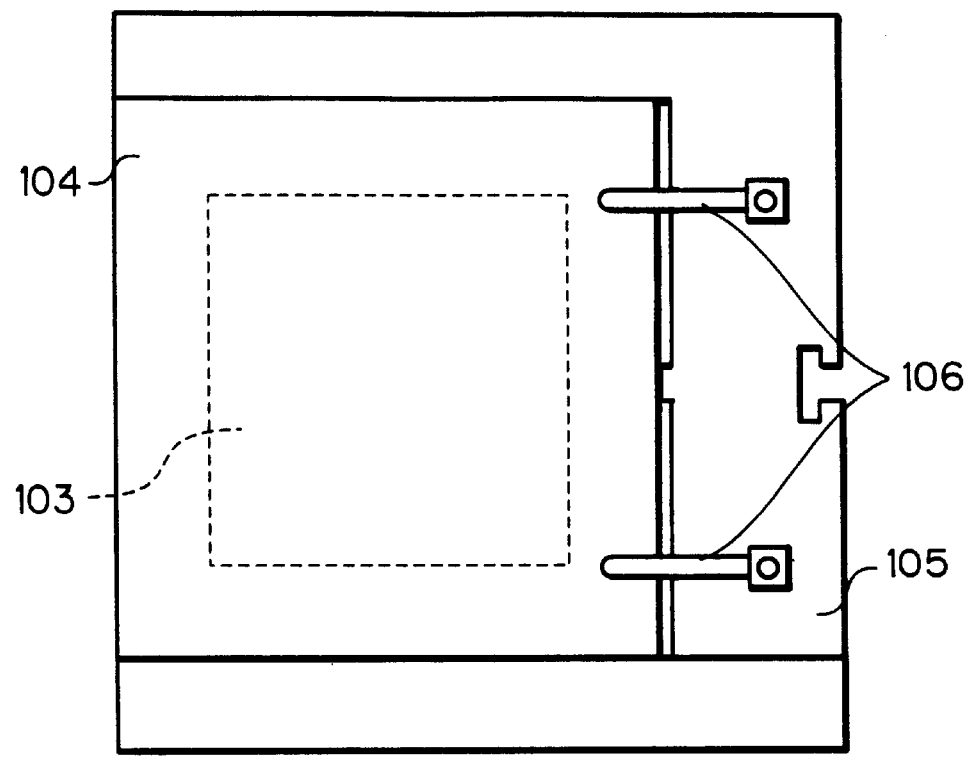
FIG. 1C is a plan view of a cassette of an electron beam exposure apparatus where the photomask of FIGS. 1A and 1B is set.
Figure 1D:
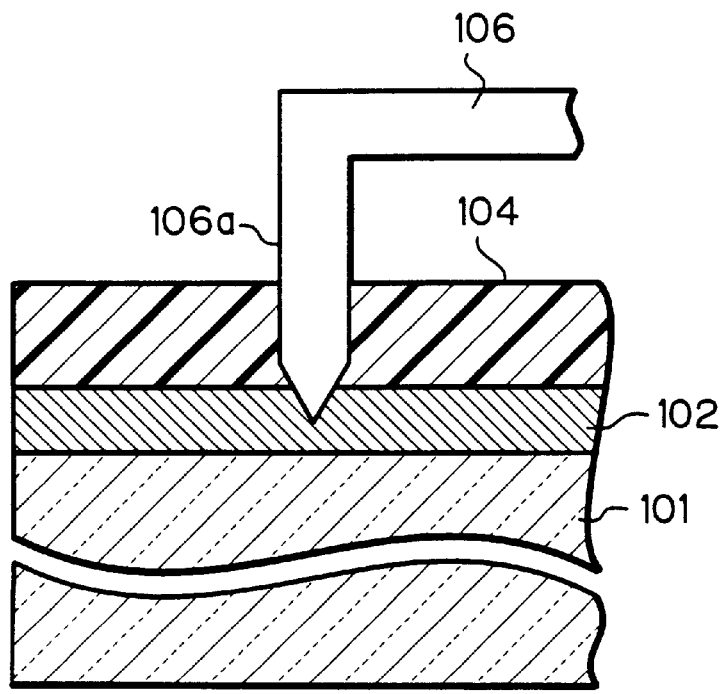
FIG. 1D is a cross-sectional view of the photomask around the conductive pin of FIG. 1C.

An electron beam resist layer 104, which is shown not in FIGS. 1A and 1B, but in FIGS. 1C and 1D, is coated on the entire surface of the photomask of FIGS. 1A and 1B. Then, as illustrated in FIG. 1C, the photomask is set in a cassette 105 of an electron beam exposure apparatus. Then, conductive plates (spring) 106 are set on the photomask. As a result, conductive pins 106a of the conductive plates 106 easily penetrate the electron beam resist layer 104 to reach the optical shield layer 102, since there is no reflection avoiding layer beneath the conductive pins 106a as illustrated in FIG. 1D. Thus, electrons charged at the optical shield layer 102 by electron beams are effectively discharged from the conductive plates 106.

In the first prior art photomask as illustrated in FIGS. 1A through 1D, however, since the formation of the reflection avoiding layer 103 on the optical shield layer 102 by an evaporation process needs a holder for covering the periphery of the optical shield layer 102, the thickness of the reflection avoiding layer 103 becomes nonuniform, particularly around the edge of such a holder.

Figure 2:
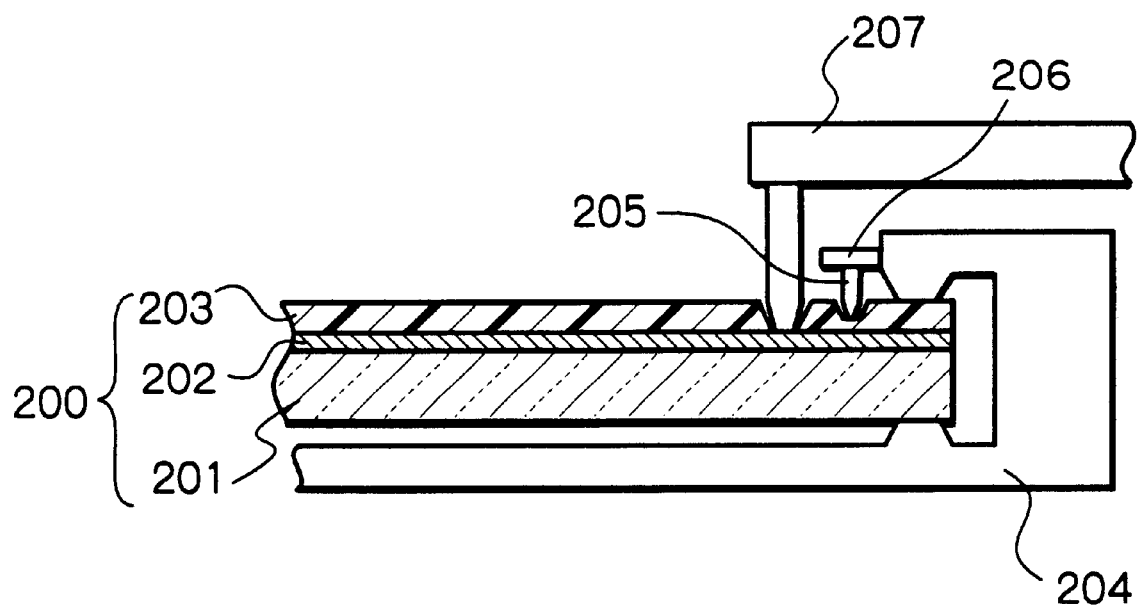
FIG. 2 is a cross-sectional view illustrating a second prior art photomask.

In FIG. 2, which illustrates a second prior art photomask (see JP-A-2-125416), a photomask 200 formed by a glass substrate 201, an optical shield layer 202 made of Cr and an electron beam resist layer 203 is set on a cassette 204 of an electron beam exposure apparatus. Note that the photomask may include a reflection avoiding layer (not shown) between the optical shield layer 202 and the electron beam resist layer 203. Also, a conductive pin 205 supported by a spring 206 at the cassette 204 is in contact with the electron beam resist 203. Further, a high power supply electrode, 207 penetrates the electron beam resist layer 203 and reaches the optical shield layer 202. In this state, when a high power supply voltage is applied to the high power supply electrode 207, the portion of the electron beam resist layer 203 between the conductive pin 205 and the optical shield layer 202 is electrostatically destroyed, so that the conductive pin 205 is electrically in contact with the optical shield layer 202. Then, the high power supply electrode 207 is removed. Thus, electrons charged at the optical shield layer 202 by electron beams are effectively discharged from the conductive pin 205.

The second prior art photomask as illustrated in FIG. 2, however, makes the apparatus complex, thus increasing the manufacturing cost.

An embodiment of the antistatic system according to the present invention will be explained next with reference to FIGS. 3 through 6.

Figure 3A:
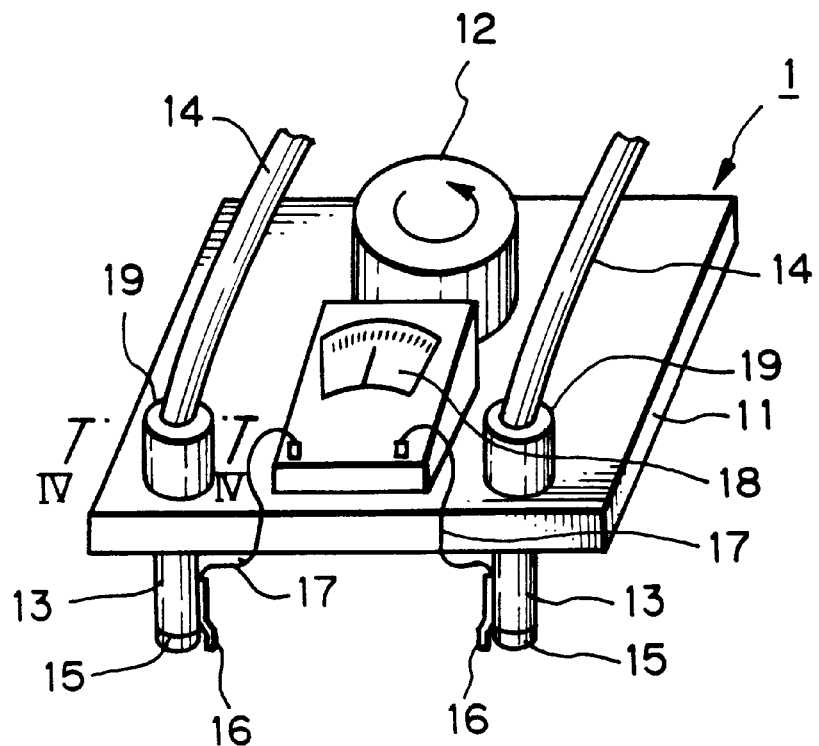
FIG. 3A is a perspective view illustrating a conductive pin mounting apparatus according to the present invention.
Figure 3B:
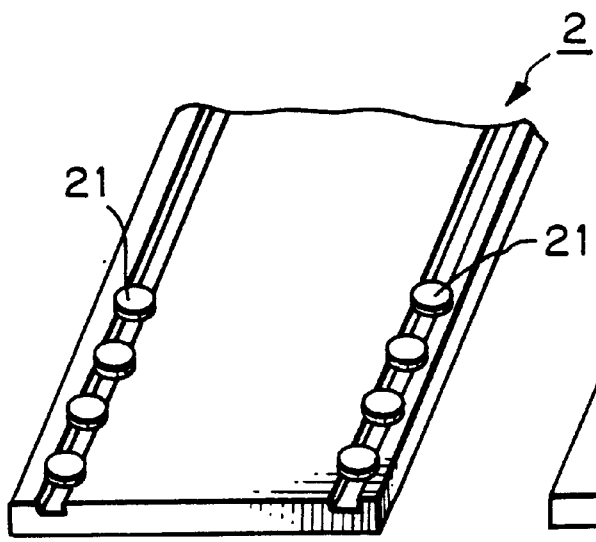
FIG. 3B is a perspective view illustrating a conductive pin stand according to the present invention.
Figure 3C:
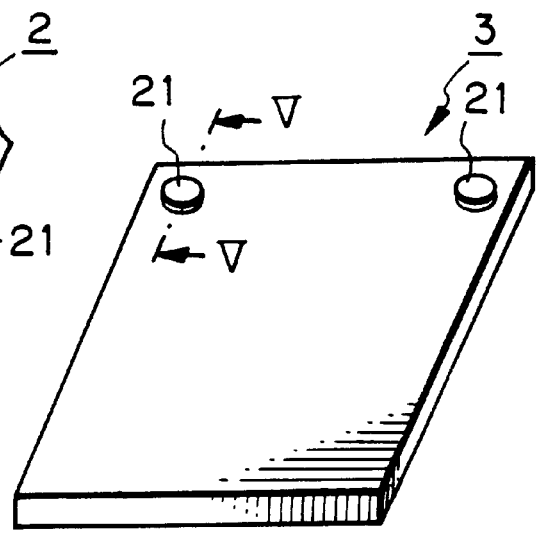
FIG. 3C is a perspective view illustrating a photomask according to the present invention.

FIG. 3A is a perspective view illustrating a conductive pin mounting apparatus 1 according to the present invention, FIG. 3B is a perspective view illustrating a conductive pin stand 2 according to the present invention, and FIG. 3C is a perspective view illustrating a photomask 3 according to the present invention.

The conductive pin mounting apparatus 1 of FIG. 3A picks up conductive pins 21 from the conductive pin stand 2 as illustrated in FIG. 3B, and mounts the conductive pins 21 on the photomask 3 as illustrated in FIG. 3C.

The conductive pin mounting apparatus 1 of FIG. 3A is explained next in more detail.

A base 11 is movable by a rotating shaft 12 driven by a rotary cylinder or an air cylinder (not shown). That is, the rotating shaft 12 can be moved up and down in a vertical direction, moved in a horizontal direction and rotated along its axis. Also, two suction arms 13 are fixed to the base 11 and are connected to two air suction tubes 14 which are connected to a vacuum source (not shown). Each of the suction arms 13 is formed by a hollow cylinder having a suction pad 15 for sucking a conductive pin 21. Each of the suction pads forms a hollow cylinder made of macromolecular material.

Resistance detection pins 16 made of Cu or the like are fixed on the sides of the suction arms 13; however, the resistance detection pins 16 are electrically isolated from the suction arms 13. That is, the resistance detection pins 16 except for their ends are covered by rubber or the like. Therefore, when the suction pads 15 are in contact with conductive pins 21, the resistance detection pins 16 are also in contact with the conductive pins 21.

The resistance detection pins 16 are connected by wire 17 to a resistance measuring meter 18, thus monitoring a resistance between the resistance detection pins 16. The resistance measuring meter 18 can display a resistance value from $0\,\Omega$ to $\infty\,\Omega$.

Figure 4:
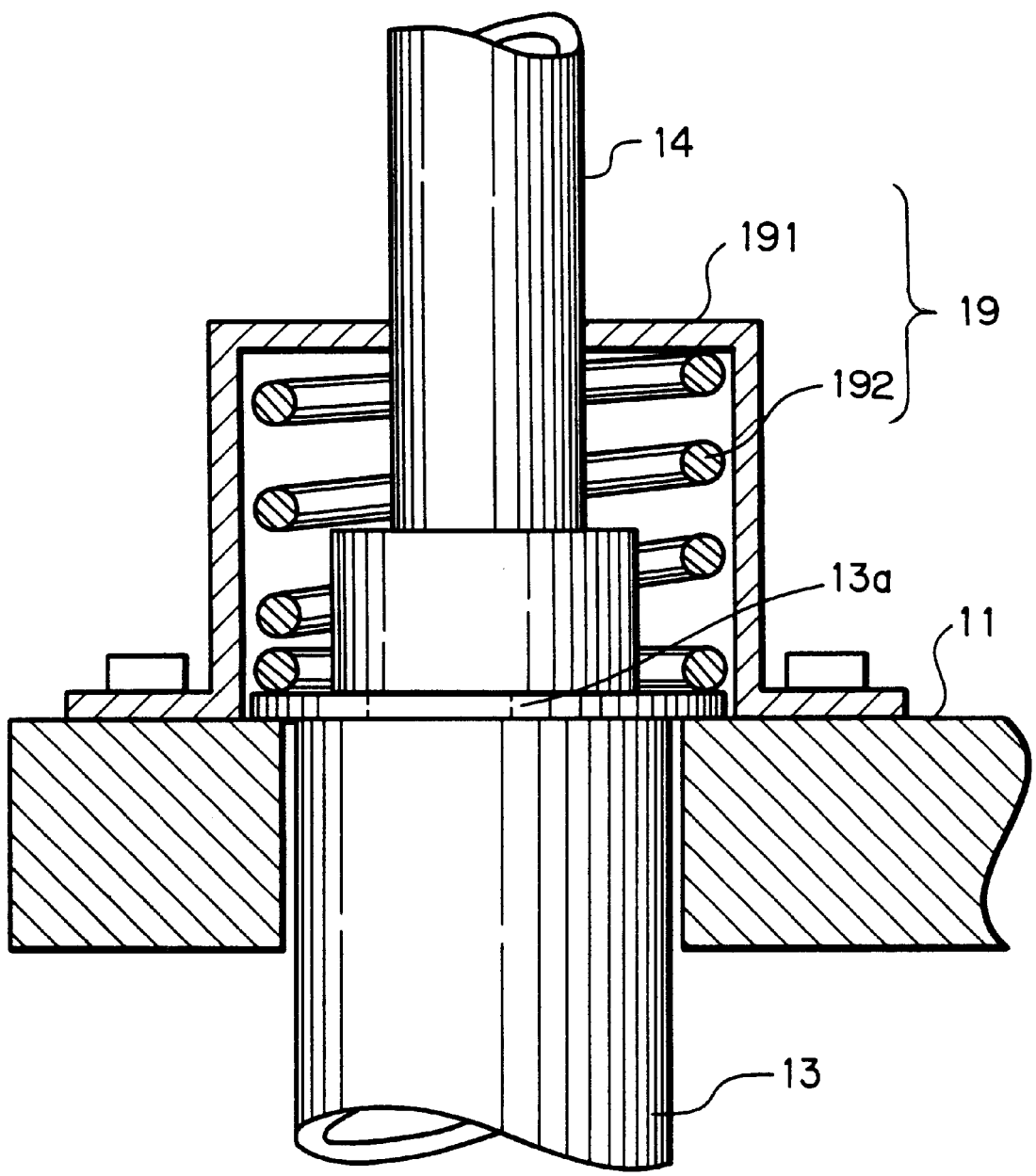
FIG. 4 is a sectional view taken along the line IV—IV of FIG. 3A.

Also, force adjusting units 19 for adjusting forces applied to conductive pins are provided on the base 11. That is, as illustrated in FIG. 4 which is a cross-sectional view taken along the line IV—IV of FIG. 3A, each of the force adjusting units 19 is formed by a casing 191 fixed to the base 11 and a spring 192 for pushing the suction arm 13 at its step portion 13a. The 10 spring 192 is encapsulated in the casing 191. Thus, the force applied to the suction arm 13 can be adjusted by the compression of the spring 192.

Referring to FIG. 3B; conductive pins 21 are arranged in two rows, and thus, the conductive pin mounting apparatus of FIG. 3A can easily pick up the conductive pins 21.

Figure 5:
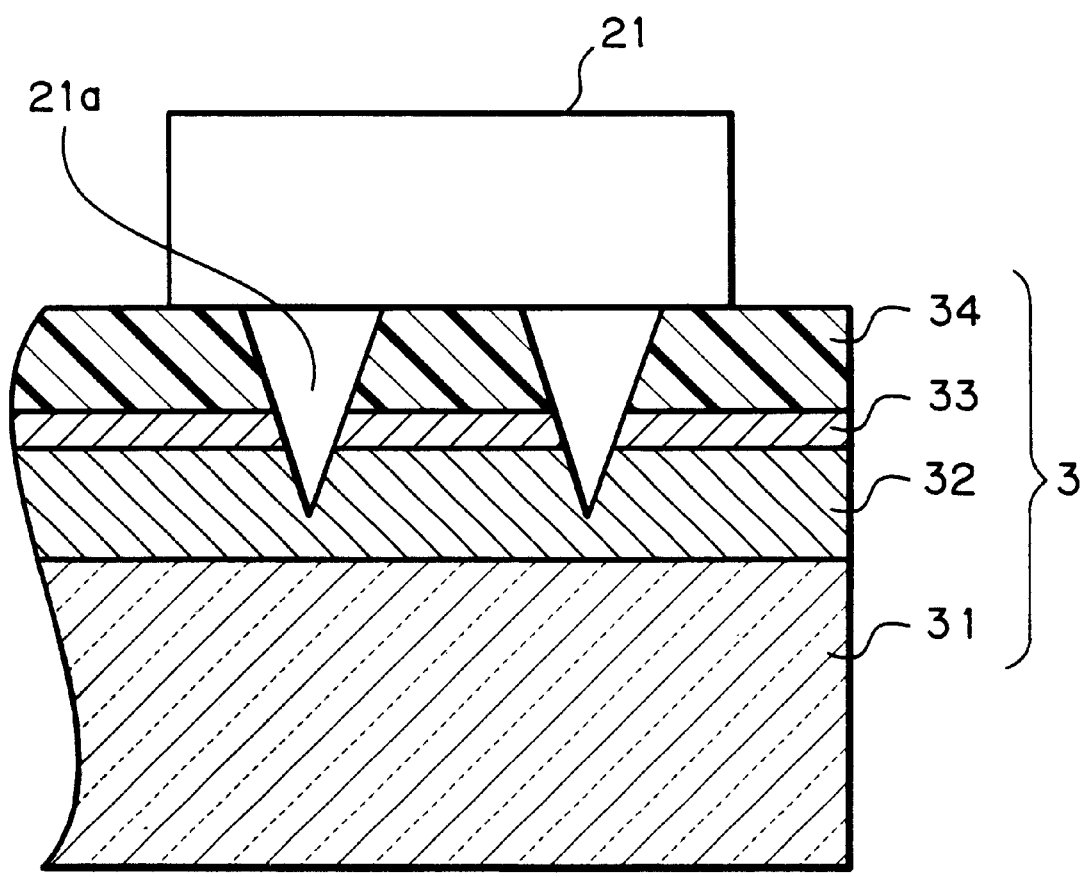
FIG. 5 is a cross-sectional view taken along the line V—V of FIG 3C.

The conductive pin 21 of FIG. 3B and the photomask 3 of FIG. 3C are explained next in more detail with reference to FIG. 5. The photomask 3 is constructed by a glass substrate 31 and an optical shield layer 32 made of Cr or the like, and a reflection avoiding layer 33 made of CrO or the like. Also, an electron beam resist layer 34 is deposited on the reflection avoiding layer 33. The conductive pin 21 is of a circular or polygonal shape that has at least one conical protrusion 21a. The conical protrusion 21a of the conductive layer 21 penetrates the electron beam resist layer 34 and the reflection avoiding layer 33 and reaches the optical shield layer 32. Thus, electrons charged at the optical shield layer 32 by electron beams are effectively discharged from the conductive pin 21.

The operation of the conductive pin mounting apparatus 1 of FIG. 3A is explained next with reference to FIGS. 6A, 6B, 6C and 6D.

Figure 6A:
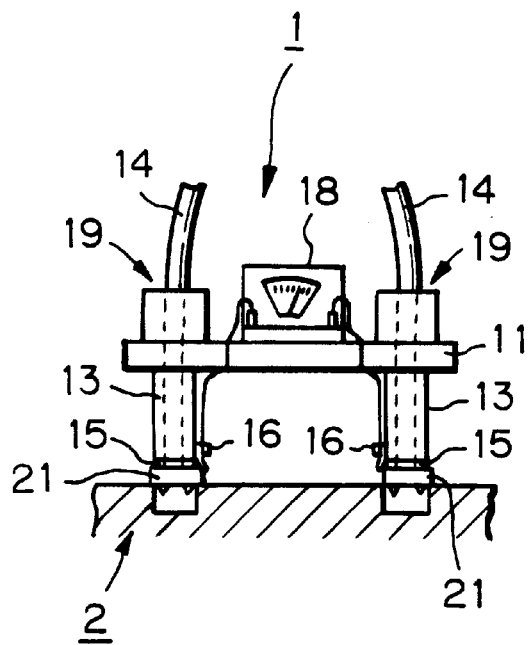
FIGS. 6A, 6B, 6C and 6D are diagrams for explaining the operation of the conductive pin mounting apparatus of FIG. 3A.

First, referring to FIG. 6A, the conductive pin mounting apparatus 1 is moved down to the conductive pin stand 2. As a result, two conductive pins 21 on the conductive pin stand 2 are sucked by the suction arms 13. In this case, due to the presence of insulating suction pads 15 on the ends of the suction arms 13, the suction arms 13 are electrically isolated from the conductive pins 21. On the other hand, the resistance detection pins 16 are in contact with the conductive pins 21. As a result, the resistance measuring meter 18 shows a resistance value such as $1000\,\Omega$ determined mainly by the conductive pin stand 2.

Figure 6B:
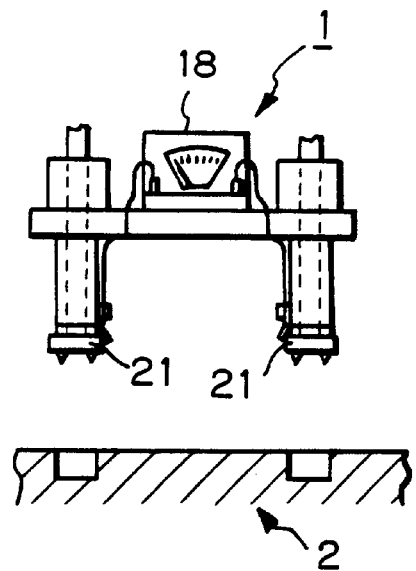

Next, referring to FIG. 6B, the conductive pin mounting apparatus 1 is moved up. As a result, the connection between the conductive pins 21 is opened, so that the resistance measuring meter 18 shows a resistance value such as $\infty\,\Omega$.

Figure 6C:
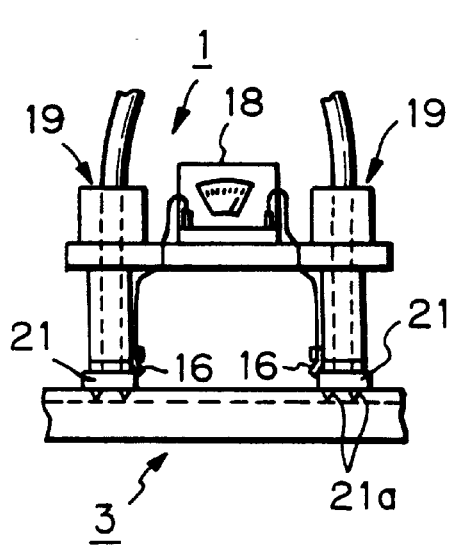

Next, referring to FIG. 6C, the conductive pin mounting apparatus 1 is moved down to the photomask 3. This continues until the resistance measuring meter 18 shows a resistance value such as $1000\,\Omega$ determined mainly by the optical shield layer 32. That is, in this state, the protrusions 21a penetrate the electron beam resist layer 34 and the reflection avoiding layer 33 to reach the optical shield layer 32 (see FIG. 5). Note that the force applied to the photomask 3 is made optimum by the force adjusting unit 19 as illustrated in FIG. 4.

Figure 6D:
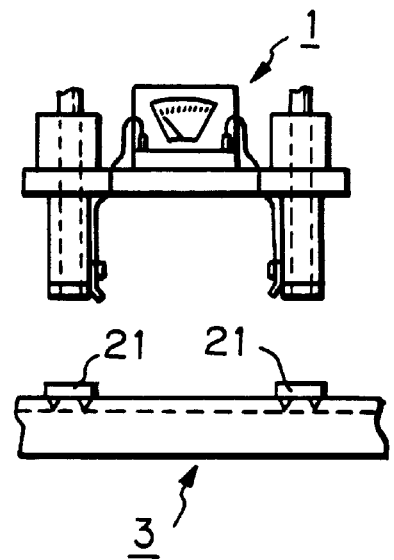

Finally, referring to FIG. 6D, the suction of the conductive pins 21 by the suction arms 13 is stopped, and then, the conductive pin mounting apparatus 1 is moved up.

Figure 7A:
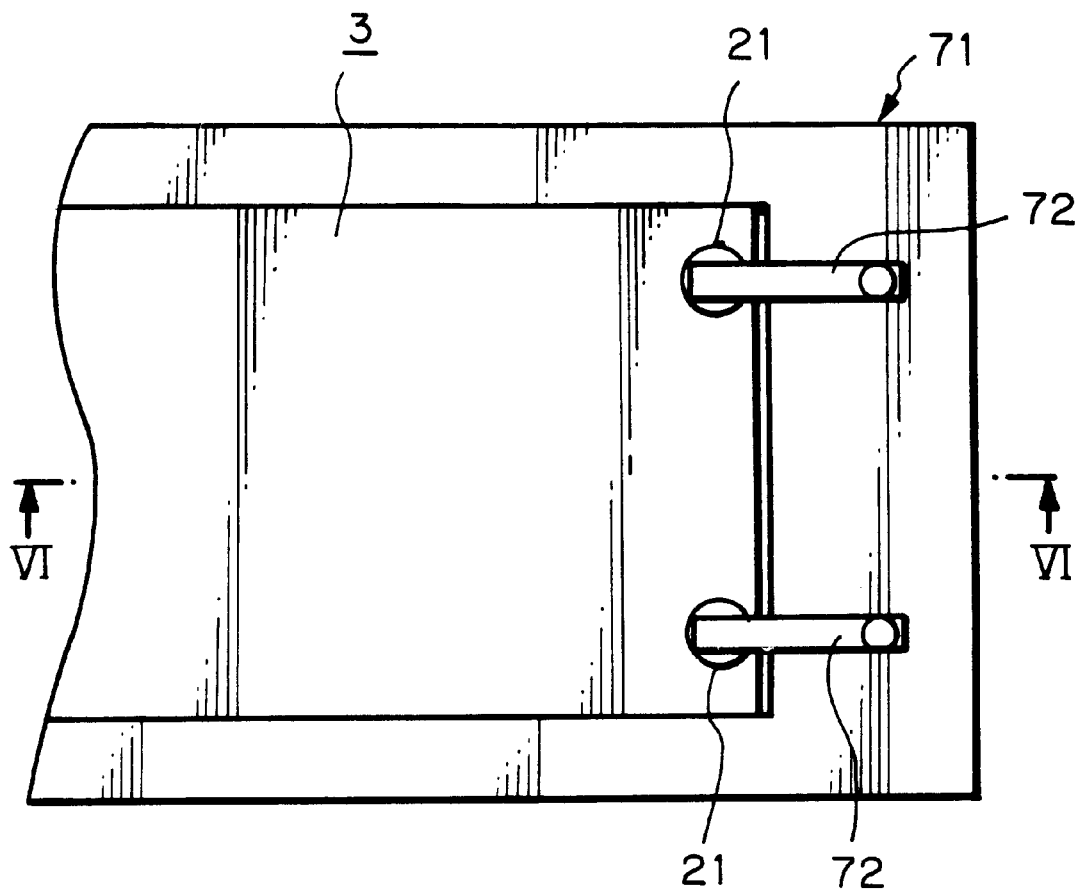
FIG. 7A is a plan-view of a cassette of an electron beam exposure apparatus where the photomask of FIG. 3C is set.
Figure 7B:
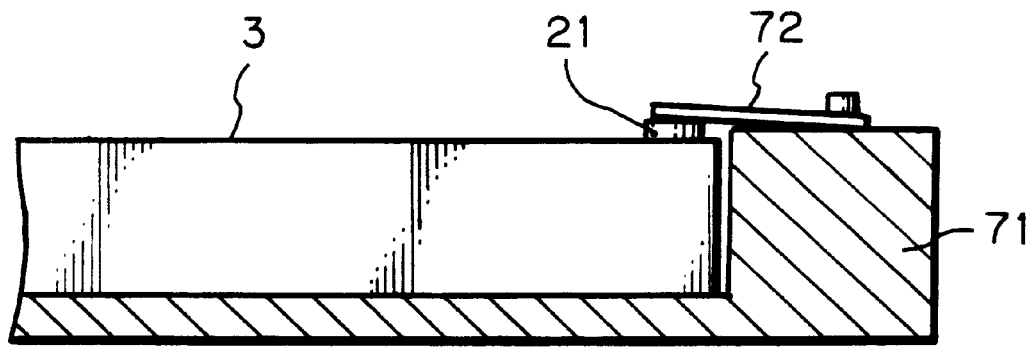
FIG. 7B is a cross-sectional view taken along the line VII—VII of FIG. 7A.

Next, the photomask 3 mounting the conductive pins 21 as illustrated in FIG. 6D is set in a cassette 71 of an electron beam exposure apparatus as illustrated in FIGS. 7A and 7B. Then, conductive plates (springs) 72 made of Cu are coupled between the conductive pins 21 and the cassette 71. Thus, electrons charged at the optical shield layer 32 of the photomask 3 are effectively discharged from the conductive pins 21 via the conductive plate 72 to the cassette 71.

In FIG. 4 although the force applied to the photomask is adjusted by the force adjusting unit 19 using the spring 192, the force adjusting unit 19 can be replaced by a force adjusting unit using air pressure or fluid pressure.

As explained hereinabove, according to the present invention,.since the conductive pins penetrate the photomask while the resistance therebetween is monitored, the conductive pins can be securely in contact with the optical shield layer. As a result, electrons charged at the optical shield layer by electron beams can be effectively discharged from the conductive pins. In addition, since the force applied to the conductive pins is adjusted by the force adjusting unit using a spring or the like, an excessive force applied to the photomask can be avoided, thus preventing distortion in the photomask.

What is claimed is:

1. A conductive pin mounting apparatus for mounting antistatic conductive pins on a photomask including a conductive optical shield layer, comprising:

at least two suction arms which contact said antistatic conductive pins and are operative to suction said antistatic conductive pins, said suction arms being electrically insulated from said antistatic conductive pins;

at least two resistance, detection pins, each coupled to a respective side of said at least two suction arms, each of said resistance detection pins being in contact with a corresponding one of said antistatic conductive pins; and a resistance measuring meter connected to said resistance detection pins, said resistance measuring meter being operative to detect a resistance value between said resistance detection pins.

2. The apparatus as set forth in claim 1, further comprising at least two insulating suction pads each provided at an end of one of said suction arms.

3. The apparatus as set forth in claim 1, further comprising at least two force adjusting units, each provided for one of said suction arms, for adjusting a force applied by said one of said suction arms to said photomask.

4. The apparatus as set forth in claim 3, wherein each of said force adjusting units comprises a spring for pushing said one of said suction arms.

5. An antistatic conductive pin means for penetrating an electron beam resist layer, a reflection avoiding layer and an optical shield layer of a photomask in an electron beam apparatus, and for discharging electrons from the photomask.

6. The antistatic conductive pin of claim 5, wherein said antistatic conductive pin means has a circular shape with at least one conical protrusion.

7. The antistatic conductive pin means of claim 5, wherein said antistatic conductive pin means has a polygonal shape with at least one conical protrusion.

8. A conductive pin mounting apparatus, comprising:

suction means for moving antistatic conductive pins and inserting said antistatic conductive pins in a photomask;

at least two resistance detection pins respectively provided at sides of said suction means, said resistance detection pins contact said antistatic conductive pins; and a resistance measuring meter connected to said resistance detection pins, said resistance measuring meter being operative to detect a resistance value between said resistance detection pins.

9. The apparatus as set forth in claim 8, wherein said photomask includes a conductive optical shield layer.

* * * * *